United States Patent
Lee et al.

(10) Patent No.: US 9,457,550 B2
(45) Date of Patent: Oct. 4, 2016

(54) METHOD FOR MANUFACTURING METAL ENCAPSULATION MEMBER

(71) Applicant: TGO Tech. Corporation, Hwaseong-si (KR)

(72) Inventors: Dong Jin Lee, Jeonju-si (KR); Yoo Jin Lee, Yongin-si (KR); Jae Hak Lee, Seoul (KR)

(73) Assignee: TGO TECH. CORPORATION (KR)

( * ) Notice: Subject to any disclaimer, the term of this patent is extended or adjusted under 35 U.S.C. 154(b) by 0 days.

(21) Appl. No.: 14/260,575

(22) Filed: Apr. 24, 2014

(65) Prior Publication Data

US 2014/0326402 A1    Nov. 6, 2014

(30) Foreign Application Priority Data

May 2, 2013    (KR) .................. 10-2013-0049383

(51) Int. Cl.
| | |
|---|---|
| *H01L 51/56* | (2006.01) |
| *H01L 33/52* | (2010.01) |
| *B32B 38/10* | (2006.01) |
| *B32B 37/18* | (2006.01) |
| *H01L 51/52* | (2006.01) |
| *H01L 33/56* | (2010.01) |
| *H01L 33/54* | (2010.01) |
| *B32B 37/12* | (2006.01) |
| *B32B 38/00* | (2006.01) |
| *B32B 38/18* | (2006.01) |

(52) U.S. Cl.
CPC .......... *B32B 37/18* (2013.01); *H01L 51/5253* (2013.01); *B32B 37/12* (2013.01); *B32B 38/10* (2013.01); *B32B 38/105* (2013.01); *B32B 38/1841* (2013.01); *H01L 33/52* (2013.01); *H01L 33/54* (2013.01); *H01L 33/56* (2013.01); *H01L 51/56* (2013.01); *Y10T 156/108* (2015.01); *Y10T 156/1052* (2015.01); *Y10T 156/1062* (2015.01); *Y10T 156/1064* (2015.01); *Y10T 156/1082* (2015.01)

(58) Field of Classification Search
CPC .................. Y10T 156/1082; Y10T 156/1064; Y10T 156/1052; Y10T 156/1062; Y10T 428/1438; Y10T 428/15; H01L 51/56; H01L 33/52; H01L 33/54; H01L 33/56; B32B 38/10; B29C 2793/0054
See application file for complete search history.

(56) References Cited

U.S. PATENT DOCUMENTS

| | | | |
|---|---|---|---|
| 2008/0073025 A1* | 3/2008 | Lee | B32B 38/04 156/268 |
| 2010/0052523 A1* | 3/2010 | Kim et al. | 313/504 |
| 2011/0116736 A1* | 5/2011 | Kim | G02B 6/4214 385/14 |
| 2013/0048209 A1* | 2/2013 | Ooyabu et al. | 156/248 |

(Continued)

FOREIGN PATENT DOCUMENTS

| | | |
|---|---|---|
| JP | 2004303529 | 10/2004 |
| JP | 2010103040 | 5/2010 |
| JP | 2013216079 A * | 10/2013 |

(Continued)

*Primary Examiner* — Linda L Gray
(74) *Attorney, Agent, or Firm* — Cantor Colburn LLP

(57) ABSTRACT

A method for manufacturing a metal encapsulation member is disclosed. The method comprises: preparing a substrate on one side of which an adhesive material is applied; adhering a metal member onto the one side of the substrate; attaching an adhesive member onto the metal member; and removing predetermined portions of the metal member and the adhesive member.

6 Claims, 5 Drawing Sheets

(56) References Cited

U.S. PATENT DOCUMENTS

2013/0149515 A1* 6/2013 Jo ................ H05K 1/0393
 428/216
2014/0144685 A1* 5/2014 Ho ................ H05K 3/281
 174/258

FOREIGN PATENT DOCUMENTS

| KR | 2019990031260 | 7/1999 |
| KR | 1020110047654 | 5/2011 |
| KR | 1020130014111 | 2/2013 |
| WO | WO0059275 A * | 10/2000 |

* cited by examiner

METHOD FOR MANUFACTURING METAL ENCAPSULATION MEMBER

FIELD OF THE INVENTION

The present invention relates to a method for manufacturing a metal encapsulation member. More particularly, the present invention relates to a method for manufacturing a metal encapsulation member, which may facilitate formation of a metal encapsulation member for protecting an organic electroluminescent device.

BACKGROUND OF THE INVENTION

Electroluminescent devices are actively researched among the other flat panel display devices because they may emit various colors of light, may be easily patterned and made into thin films, and have low direct current driving voltage and high luminous efficiency.

In particular, organic electroluminescent devices (OLEDs) do not require a separate light source unlike a conventional thin film transistor liquid crystal display devices (TFT-LCDs), thereby reducing the volume and weight of the devices, and may be driven with a low voltage compared to a plasma display panel. Due to those advantages, organic electroluminescent devices are expected to be widely used in the future.

Since an organic electroluminescent device is made of a plurality of organic thin films, it may react with moisture, oxygen and the like so that the lifespan of the device may be shortened. For this reason, a cap for protecting the organic electroluminescent device is covered thereon in various manners so as to prevent the organic electroluminescent device from being exposed to the outside, and such a process is referred to as an encapsulation process. Conventionally, inorganic materials such as glass and ceramic have been mainly used for an encapsulation film of the organic electroluminescent device.

An encapsulation film made of an inorganic material such as glass or ceramic does not have problems such as thermal deformation and the like. However, the glass material has a low thermal conductivity, and thus heat generated during the use of the organic electroluminescent device is not released smoothly, causing degradation of electroluminescent layers and reduction in lifespan of the organic electroluminescent device.

Accordingly, metallic encapsulation films, particularly made of Invar, have been recently used in some cases in order to solve the problems caused by the encapsulation films made of inorganic materials. Invar is a nickel-iron alloy and so named because it is invariant to temperature changes, i.e. the thermal expansion coefficient thereof is about one millionth at a temperature below 100° C. and nearly zero at room temperature. In general, Invar alloy is used as a material for components of a machine such as a precision machine, optical machine and watch, wherein the change in dimensions of such components due to temperature variation may cause errors.

Meanwhile, in order to perform a process of encapsulating an organic electroluminescent device using an encapsulation film made of Invar, a technique for facilitating the encapsulating process is required.

SUMMARY OF THE INVENTION

One object of the present invention is to provide a method for manufacturing a metal encapsulation member, which may facilitate a process for encapsulating an organic electroluminescent device.

According to one aspect of the invention to achieve the above-described object, there is provided a method for manufacturing a metal encapsulation member, comprising: preparing a substrate on one side of which an adhesive material is applied; adhering a metal member onto the one side of the substrate; attaching an adhesive member onto the metal member; and removing predetermined portions of the metal member and the adhesive member.

In addition, there may be further provided other configurations to implement the present invention.

According to the present invention, there is provided a method for manufacturing a metal encapsulation member, which may facilitate a process for encapsulating an organic electroluminescent device. In addition, there is provided a method for manufacturing a metal encapsulation member, which may advantageously reduce costs by simplifying the manufacturing process.

DETAILED DESCRIPTION OF THE PREFERRED EMBODIMENTS

Figure 1:
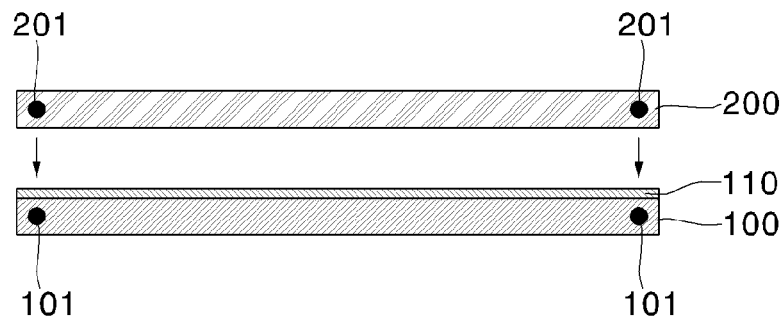
FIGS. 1 to 7 illustrate a method for manufacturing a metal encapsulation member according to one embodiment of the present invention.

In the following detailed description of the present invention, references are made to the accompanying drawings that show, by way of illustration, specific embodiments in which the invention may be practiced. These embodiments are described in sufficient detail to enable those skilled in the art to carry out the invention. It is to be understood that the various embodiments of the invention, although different from each other, are not necessarily mutually exclusive. For example, specific shapes, structures and characteristics described herein may be implemented as modified from one embodiment to another without departing from the spirit and scope of the invention. Further, it shall be understood that the locations or arrangements of individual elements within each of the embodiments described herein may also be modified without departing from the spirit and scope of the invention. Accordingly, the following detailed description is not to be taken in a limiting sense, and the scope of the invention is to be taken as encompassing the scope of the appended claims and all equivalents thereof, as long as properly described. In the drawings, like reference numerals refer to the same or similar functions throughout the several views, and certain features such as length, area, thickness and shape may be exaggerated for convenience.

Hereinafter, various preferred embodiments of the present invention will be described in detail with reference to the accompanying drawings to enable those skilled in the art to easily carry out the invention.

FIGS. 1 to 7 illustrate a method for manufacturing a metal encapsulation member according to one embodiment of the present invention.

Referring to FIG. 1, a substrate 100, on one side of which an adhesive material 110 is applied, may be provided and a metal member 200 may be adhered onto the one side where the adhesive material 110 is applied.

The substrate 100 is preferably flexible to allow the substrate 100 to be easily removed, because the substrate 100 is removed when an encapsulation process for an organic electroluminescent device is performed later using a metal encapsulation member manufactured according to one embodiment of the present invention. Accordingly, the substrate 100 is preferably made of a material such as PET.

Figure 2:
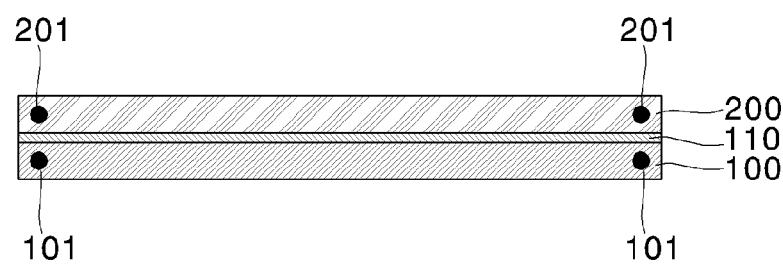

The metal member 200 may serve to prevent oxygen, moisture, or other particles from permeating into the device from outer environments. The metal member 200 according to one embodiment of the present invention is preferably made of an iron-nickel (Fe—Ni) alloy including Invar. Invar refers to an iron-nickel alloy consisted of 36% nickel and 64% iron. Since the coefficient of thermal expansion (CTE) of Invar is very small, it may prevent the problem of reduction in reliability and lifespan of the organic electroluminescent device caused by deformation occurring when employing other metallic materials (e.g., thermal deformation occurring at a contact region between the substrate and the metal member due to repeated temperature increase and decrease resulting from the heat generated when driving the organic electroluminescent device). In addition, since the metal member 200 made of Invar has a high thermal conductivity, the heat generated in the organic electroluminescent device may be smoothly released, thereby preventing degradation of the organic electroluminescent device. Besides Invar, the metal member 200 according to one embodiment of the present invention may also employ an iron-nickel alloy consisted of 42% nickel and 58% iron. In order to ensure alignment between the substrate 100 and the metal member 200, alignment keys 101 and 201 may be formed on the substrate 100 and the metal member 200, respectively. FIG. 2 illustrates that the metal member 200 is adhered onto the one side of the substrate 100 where the adhesive material 110 is applied.

Figure 3:
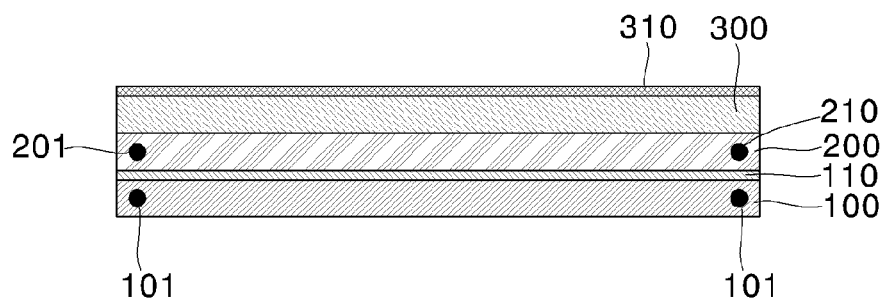

Referring to FIG. 3, an adhesive member 300 may be attached onto the metal member 200. The adhesive member 300 serves as a filler material and has an adhesive property so that it may also serve to improve the adhesive strength between the metal member 200 and the organic electroluminescent device. The adhesive member 300 may employ a resin, which is an organic substance. Further, the adhesive member 300 consisted of a thin plate made of a resin or the like may be stored in a rolled state before it is attached onto the metal member 200, and a protective film 310 may be attached onto one side of the adhesive member 300 in order to facilitate the storage. Accordingly, the adhesive member 300 in a rolled state may be unwound to be placed on the metal member 200, and a pressure may be applied to cause the adhesive member 300 and the metal member 200 to be attached to each other.

Figure 4:
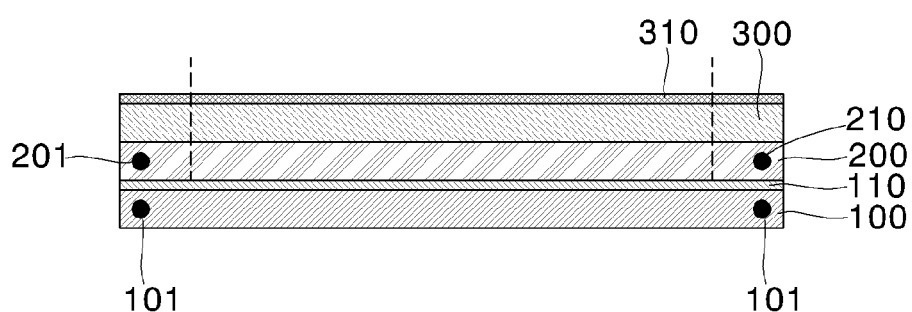

Referring to FIG. 4, predetermined portions of the metal member 200, the adhesive member 300 and the protective film 310 may be removed. The portions indicated by dotted lines in FIG. 4 represent where a press cutter is applied to remove the corresponding portions from the metal member 200, the adhesive member 300 and the protective film 310. That is, predetermined portions of the metal member 200, the adhesive member 300 and the protective film 310 may be removed to conform to the size and shape of the organic electroluminescent device. To this end, an apparatus such as a press cutter may be used. Accordingly, as compared to the conventional method for manufacturing a metal encapsulation member, the method for manufacturing a metal encapsulation member according to the present invention has an advantage of manufacturing the metal encapsulation member through a simple process.

Figure 5A:
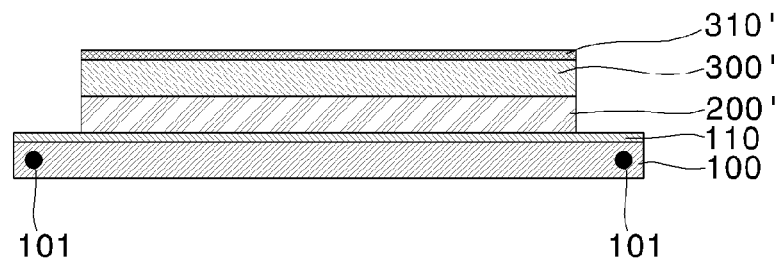
Figure 5B:
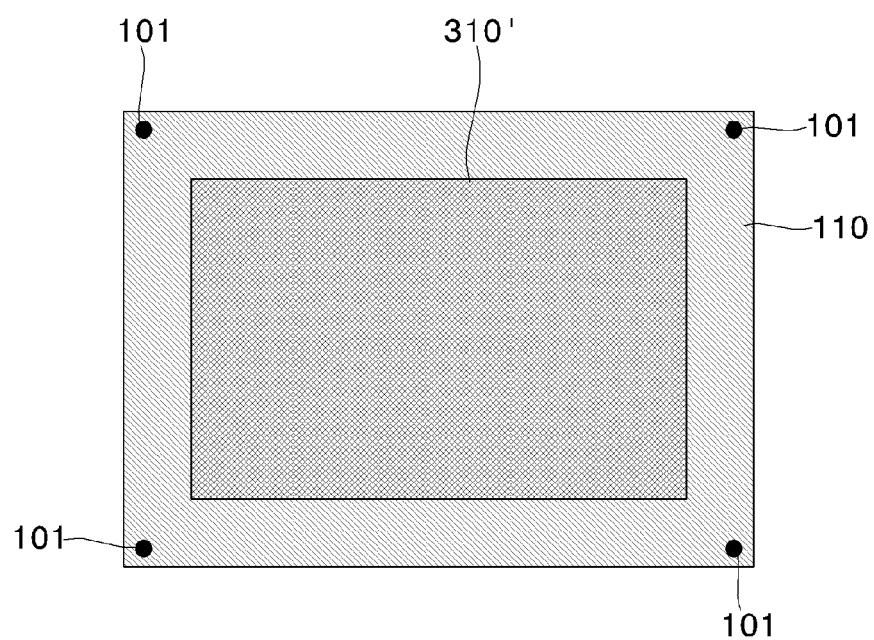

FIG. 5A illustrates the metal member 200', the adhesive member 300' and the protective film 310' after removing the predetermined portions of the metal member 200 and the adhesive member 300, and FIG. 5B is a top view of FIG. 5A.

Figure 6:
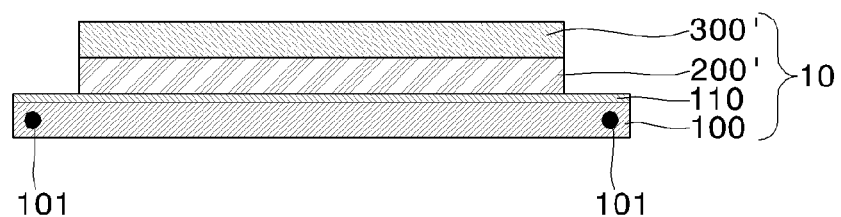

Referring to FIG. 6, the protective film 310' formed on the adhesive member 300' may be removed. The protective film 310' may not be an essential component in a metal encapsulation member 10 to be eventually formed, because it is attached to one side of the adhesive member 300, 300' to facilitate the storage of the adhesive member 300, 300' in a rolled state, as described above. Upon removing the protective film 310', the remaining structure may be considered as the metal encapsulation member 10 for encapsulating the organic electroluminescent device. Meanwhile, in order to store the metal encapsulation member until it is used for encapsulating the organic electroluminescent device, the metal encapsulation member may be protected by a protective member 400 to be described below.

Figure 7:
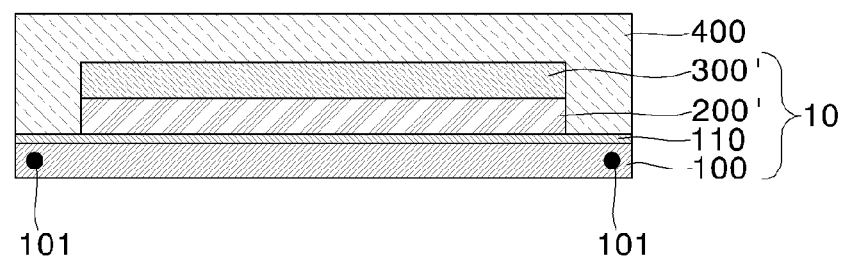

Referring to FIG. 7, the protective member 400 may be attached onto the substrate 100 to enclose the metal member 200' and the adhesive member 300' remaining after the predetermined portions thereof are removed. As described above, the protective member 400 is provided to prevent the metal encapsulation member 10 from being exposed to the outside and damaged while the metal encapsulation member 10 is stored until it is used for encapsulating the organic electroluminescent device.

Figure 8:
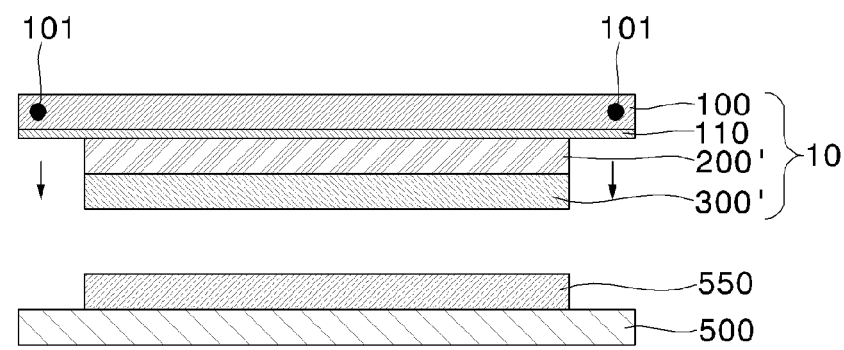
FIGS. 8 and 9 illustrate a method for encapsulating an organic electroluminescent device using a metal encapsulation member according to one embodiment of the present invention.
Figure 9:
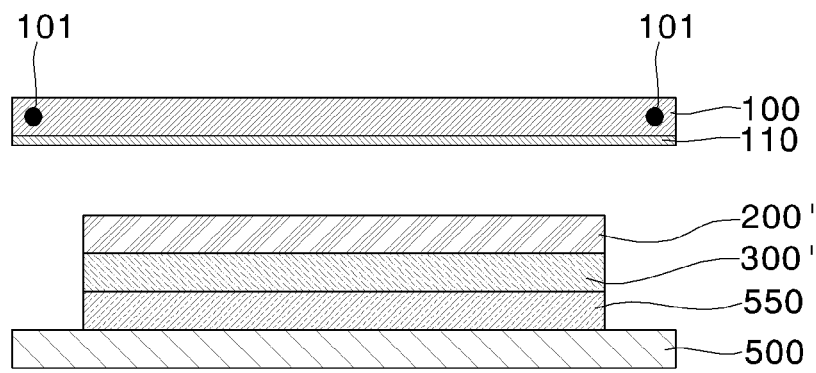

FIGS. 8 and 9 illustrate a method for encapsulating an organic electroluminescent device using a metal encapsulation member according to one embodiment of the present invention. The method for encapsulating an organic electroluminescent device using a metal encapsulation member will be described below with reference to FIGS. 8 and 9. First, as illustrated in FIG. 8, the protective member 400 on the metal encapsulation member 10 is removed and the metal encapsulation member 10 may be turned over and disposed such that the adhesive member 300' faces downward. In that state, the adhesive member 300' is placed on the organic electroluminescent device 500 and 550, and a pressure is applied to the organic electroluminescent device and the metal encapsulation member 10 such that the adhesive member 300' may be attached to the organic electroluminescent device 500 and 550. Then, as illustrated in FIG. 9, the substrate 100 and the adhesive material 110 may be removed when the adhesive member 300' is attached to the organic electroluminescent device 500 and 550.

Although the present invention has been illustrated and described as above in connection with the preferred embodiments, the invention is not limited to the above embodiments, and various modifications and changes may be made by those skilled in the art without departing from the spirit and scope of the invention. Such modifications and changes should be considered to fall within the scope of the present invention and the appended claims.

What is claimed is:

1. A method for manufacturing a metal encapsulation member, comprising:
preparing a substrate;
applying an adhesive material onto a surface of the substrate to form an adhesive material layer on the substrate;
adhering a metal member onto the adhesive material layer;
attaching an adhesive member onto the metal member;
removing predetermined portions of the metal member and the adhesive member, without removing the adhesive material layer, to form exposed portions, exposing the adhesive material; and forming a removable protective member onto the exposed portions and the remaining metal member and adhesive member to enclose and protect the remaining metal member and adhesive member.

2. The method of claim 1, wherein the metal member is made of an iron-nickel alloy.

3. The method of claim 1, wherein the substrate is a flexible substrate.

4. The method of claim 1, wherein the substrate and the metal member are provided with alignment keys for alignment therebetween.

5. The method of claim 1, wherein the predetermined portions of the metal member and the adhesive member are removed through a press cutting process.

6. The method of claim 1, further comprising: forming a protective film on the adhesive member after the attaching of the adhesive member; and removing the protective film before the forming of the removable protective member.

* * * * *